United States Patent
Thorne et al.

(12)

(10) Patent No.: US 12,354,964 B1
(45) Date of Patent: Jul. 8, 2025

(54) UNDER CHIP BRIDGE

(71) Applicant: FRONTGRADE TECHNOLOGIES INC., Colorado Springs, CO (US)

(72) Inventors: Sean Thorne, Colorado Springs, CO (US); Mike Newman, Haywards Heath (GB)

(73) Assignee: FRONTGRADE TECHNOLOGIES INC., Colorado Springs, CO (US)

( * ) Notice: Subject to any disclaimer, the term of this patent is extended or adjusted under 35 U.S.C. 154(b) by 486 days.

(21) Appl. No.: 17/879,308

(22) Filed: Aug. 2, 2022

(51) Int. Cl.
*H01L 23/538* (2006.01)
*H01L 21/56* (2006.01)
*H01L 23/00* (2006.01)
*H01L 25/065* (2023.01)
*H01L 25/16* (2023.01)
*H01L 21/48* (2006.01)

(52) U.S. Cl.
CPC ........ *H01L 23/5381* (2013.01); *H01L 21/563* (2013.01); *H01L 23/5386* (2013.01); *H01L 24/16* (2013.01); *H01L 24/17* (2013.01); *H01L 24/32* (2013.01); *H01L 24/73* (2013.01); *H01L 24/81* (2013.01); *H01L 24/94* (2013.01); *H01L 25/0655* (2013.01); *H01L 25/16* (2013.01); *H01L 21/4846* (2013.01); *H01L 2224/1601* (2013.01); *H01L 2224/16221* (2013.01); *H01L 2224/1703* (2013.01); *H01L 2224/32221* (2013.01); *H01L 2224/73204* (2013.01); *H01L 2224/81203* (2013.01); *H01L 2224/81908* (2013.01); *H01L 2224/94* (2013.01)

(58) Field of Classification Search
CPC ............... H01L 23/5381; H01L 21/563; H01L 23/5386

See application file for complete search history.

(56) References Cited

U.S. PATENT DOCUMENTS

2023/0051337 A1* 2/2023 Horibe .................. H01L 21/561

OTHER PUBLICATIONS

IFTLE 491: IBM Simplifies Si Bridge Technology [site visited Sep. 21, 2022] < https://www.3dincites.com/2021/07/iftle-491-IBM-simplifies-si-bridge-technology/> (15 pages).
IBM, ECTC 2021 Conference Paper, Direct Bonded Heterogeneous Integration (DBHi) Si Bridge, [site visited Sep. 21, 2022] < https://research.ibm.com/publications/direct-bonded-heterogeneous-integration-dbhi-si-bridge> (5 pages).

* cited by examiner

*Primary Examiner* — Errol V Fernandes
(74) *Attorney, Agent, or Firm* — ALSTON & BIRD LLP (57) ABSTRACT

Systems, apparatuses, semiconductor products and methods for semiconductor packages, specifically under chip bridge system-in-packages, are provided that allow one or more bridges to connect two or more dies. For example, high density connections of two or more dies may be connected with an under chip bridge, all of which may be placed on a substrate to form a system-in-package semiconductor package. Various embodiments include methods of manufacturing such packages that include utilizing a flat semiconductor along with bumping operations that may use single sizes of bumping.

8 Claims, 10 Drawing Sheets

UNDER CHIP BRIDGE

TECHNOLOGICAL FIELD

Example embodiments of the present invention relate generally to semiconductor devices, and more particularly to semiconductor devices comprising a bridge connecting two or more dies.

BACKGROUND

High performance integrated circuits, including those addressing radio frequency (RF) applications, such as those in the aerospace industry, use System-in-Package (SiP) to integrated multiple integrated circuits into one package. Such packages may include multiple dies with a high density of interconnects. Applicants using SiPs subject them to restrictions in size, including in height, which requires that the size of an SiP may not grow to accommodate the high density of interconnects.

Prior solutions for SiPs have used an interposer or used an embedded bridge to distribute the high density interconnections between dies. In an interposer solution a large interposer is interposed between one or more chips and a substrate and may be located under the entirety of an array of dies. The interposer is between the dies and, thus, a chips do not connect directly to the substrate. Interposer techniques increase the size of SiP solutions and create additional complexities by routing signals through the interposer. Prior implementations utilizing an embedded bridge use a trough or channel created in a substrate to create room for the embedding of the bridge into the substrate. This embedded bridge is technically difficult to implement, including, for example, due to requiring a trough in the substrate before utilizing a bridge. The difficulties result in manufacturing problems, including but not limited to losses of materials due to substrate being warped or damaged if the trough or channel is too deep or not appropriately created. Additionally, the creation of a trough or channel increases expense in manufacturing. For example, if there are any inconsistencies with the underfill layer in the trough then the resulting packages are not reliable.

Figure 1:
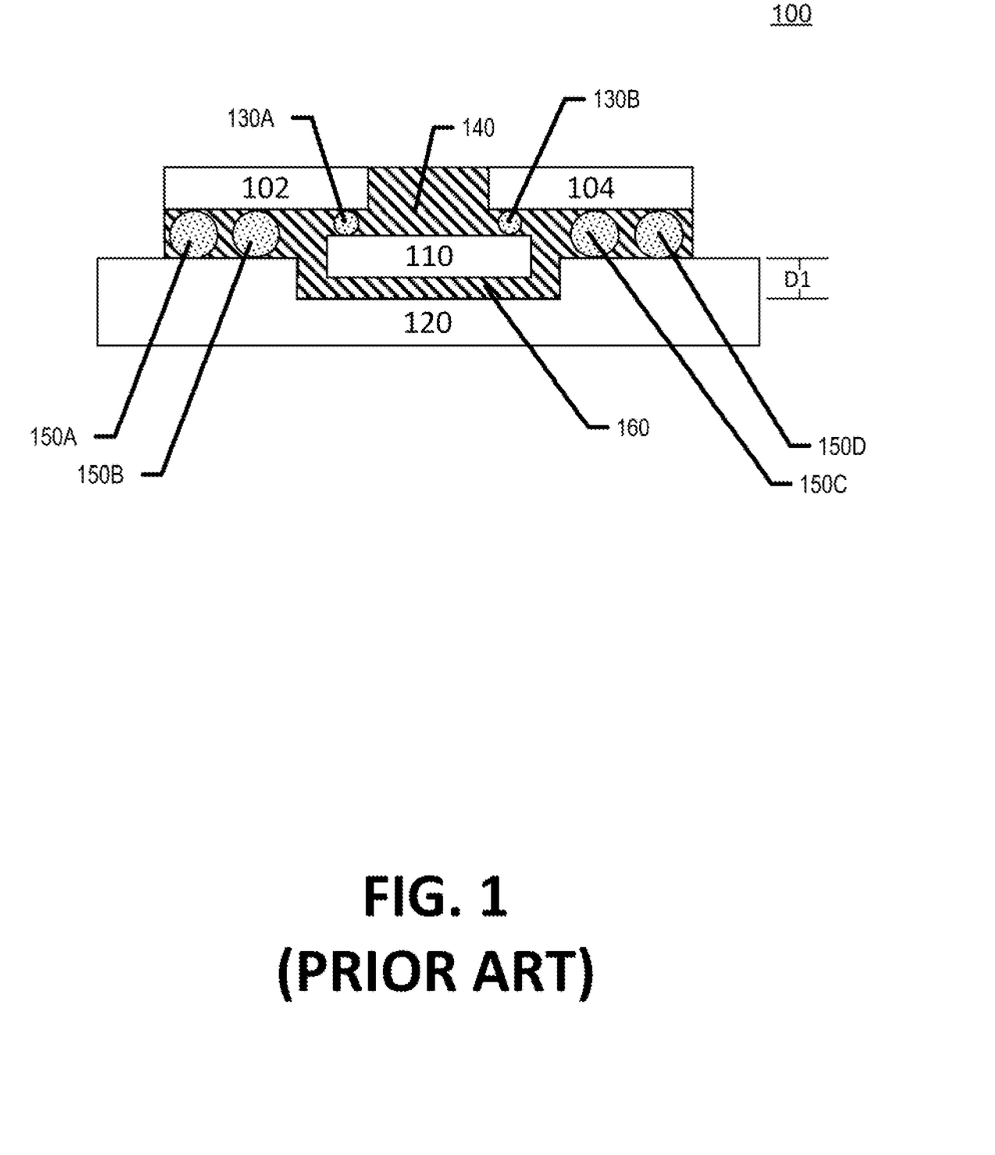
FIG. 1 illustrates an example of a prior art system utilizing a substrate with a trench and an embedded bridge.

FIG. 1 illustrates an example of embedded bridge configuration 100 of the prior art. FIG. 1 illustrates a first die 102 and a second die 104 connected by a bridge 110 where the bridge 110 is embedded in trough 160 of substrate 120. As is readily seen in FIG. 1, trough 160 has a depth, which is indicated in FIG. 1 as D1. The trough requires an amount of material to be removed from substrate 120 in order for bridge 110 to be embedded. The dies 102, 104 are connected to the bridge 110 by interconnects 130A, 130B, respectively. Interconnects 130A, 130B are solder bumps of a first size. The dies 102, 104 are connected to a substrate 120 by interconnects 150A, 150B, respectively. Interconnects 150A, 150B are solder bumps of a second size. It is known that solder bumps 150 may also be representative of metal pillars that may be used with the solder bumps for interconnects. The dies 102, 104 and bridge 110 are separated from the substrate 120 by underfill 140. Underfill 140 is added in the embedded bridge configuration 110 after interconnects 130A, 130B, 150A, 150B were formed. In the prior art of FIG. 1, the bridge is located in the substrate. In other words, as is illustrated, the lower plane of bridge 110 breaks an upper plane of substrate 120 such that bridge 110 is be located in the trench 160. In a variation of FIG. 1, the bridge 110 may be located deeper in the trench 160 such that the upper plane of the bridge 110 is below the upper plane of the substrate 120. The creation of a trench and location of the bridge creates challenges to use multiple sizes of solder bumps as well as keeping the bridge flat with the rest of the surface of the substrate 120, including during bonding and the application of underfill.

As described herein, Applicant has identified a number of deficiencies and problems associated with the present systems, apparatuses, products, and methods for semiconductors, particularly for bridges connecting two or more dies. Through applied effort, ingenuity, and innovation, many of these identified problems have been solved by developing solutions that are included in embodiments of the present disclosure, many examples of which are described in detail herein.

BRIEF SUMMARY

Various embodiments described herein relate to systems, apparatuses, semiconductor products, and methods for semiconductor packages, specifically under chip bridge system-in-packages.

In an example embodiment, an under chip bridge system-in-package is provided comprising: a first die; a second die; a substrate having a first surface, wherein the first surface of the substrate is connected to the first die and the second die, wherein the first surface of the substrate is flat, and wherein the thickness of the connection to the first and the second die are the same height; and a bridge comprising a first surface, wherein the first surface of the bridge is connected the first die and to the second die, wherein the thickness of the connection to the first die and the thickness of the connection to the second die are the same height, wherein the bridge has a thickness and the bridge thickness is uniform for the entirety of the bridge, and wherein the thickness of the bridge is less than the thickness of connection between the substrate and the first die.

In some exemplary implementations of the under chip bridge system-in-package an area of the first surface of the substrate is greater than an area of the first surface of the bridge.

In some exemplary implementations of the under chip bridge system-in-package the first die comprises a plurality of high density connections, the second die comprises a plurality of high density connections, the connection of the bridge to the first die is associated with a portion of the high density connections of the first die, and the connection of the bridge to the second die is associated with a portion of the high density connections of the second die.

In some exemplary implementations of the under chip bridge system-in-package the thickness of the bridge is less than 55 microns.

In some exemplary implementations of the under chip bridge system-in-package, the under chip bridge system-in-package further comprises a third die and a second bridge comprising a first surface, wherein the first surface of the second bridge is connected the first die and to the third die, wherein the second bridge has a thickness and the second bridge thickness is uniform for the entirety of the second bridge, and wherein the thickness of the second bridge is less than the thickness of connection between the substrate and the first die. In some exemplary implementations of the under chip bridge system-in-package a portion of the second bridge is located between a portion of the bridge and the substrate.

In some exemplary implementations of the under chip bridge system-in-package, the under chip bridge system-inpackage further comprises a third die and the first surface of the bridge is connected the third die.

In some exemplary implementations of the under chip bridge system-in-package, the under chip bridge system-in-package further comprises one or more active components.

In some exemplary implementations of the under chip bridge system-in-package, the under chip bridge system-in-package further comprises one or more passive components.

In some exemplary implementations of the under chip bridge system-in-package, the under chip bridge system-in-package further comprises one or more active components or passive components connected to the bridge.

In an example embodiment, a method of making an under chip bridge system-in-package comprising: providing a first die comprising a first surface; providing a second die comprising a second surface; providing a bridge comprising a first surface; bumping the first surface of the bridge; bonding the bumped first surface of the bridge to the first surface of the first die and the first surface of the second die to form a bridged die-SiP; providing a bridge comprising a first surface, wherein the first surface of the substrate is flat; bumping the bridged die-SiP on the first surface of the first die and the first surface of the second die; and bonding the bridged die-SiP with the bumped first surface of the bumped first die and the first surface of the second die to the first surface of the substrate.

In some exemplary implementations of the method of making an under chip bridge system-in-package, bumping the first surface of the bridge comprises solder bumps of a first size.

In some exemplary implementations of the method of making an under chip bridge system-in-package, bumping the bridged die-SiP on the first surface of the first die and the first surface of the second die comprises solder bumps of a second size.

In some exemplary implementations of the method of making an under chip bridge system-in-package, the solder bumps of the first size are smaller than the solder bumps of the second size.

In some exemplary implementations of the method of making an under chip bridge system-in-package, an area of the first surface of the substrate is greater than an area of the first surface of the bridge.

In some exemplary implementations of the method of making an under chip bridge system-in-package, bonding the bumped first surface of the bridge to the first surface of the first die and the first surface of the second die to form a bridged die-SiP comprises bonding a plurality of high density connections on the first surface of the first die to a plurality of high density connections on the first surface of the second die via the bridge.

In some exemplary implementations of the method of making an under chip bridge system-in-package, the method further comprises, prior to bonding the bumped first surface of the bridge to the first surface of the first die and the first surface of the second die to form a bridged die-SiP, backgrinding the bridge to a thickness less than 55 microns.

In some exemplary implementations of the method of making an under chip bridge system-in-package bonding the bumped first surface of the bridge to the first surface of the first die and the first surface of the second die to form a bridged die-SiP comprises a flip chip operation.

In some exemplary implementations of the method of making an under chip bridge system-in-package, the method further comprises reconstituting, prior to bonding the bumped first surface of the bridge to the first surface of the first die and the first surface of the second die to form a bridged die-SiP, the first die and the second die into a reconstituted wafer; and dicing the reconstituted wafer to extract a die-SiP comprised of the first die and the second die connected by a portion of reconstituted wafer, and wherein the first surface of the first die and the first surface of the second die face the same side In an example embodiment, under chip bridge system-in-package is made by a method described herein.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Having thus described certain example embodiments of the present disclosure in general terms, reference will now be made to the accompanying drawings, which are not necessarily drawn to scale, and wherein:

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

Overview

Various embodiments of the present invention are directed to improved systems, apparatuses, products, and methods for semiconductors using one or more under chip bridges (UCB). The UCB described herein allows for improved high density interconnections between two or more dies. The dies are prepared in a flip chip configuration with the primary bump array. The bridge may include one or more interconnect layers on the top side of the bridge, which may allow for the routing of signals between two more dies. The bridge is added by a flip-chip process described herein. By utilizing one or more bridges, the instant UCB configuration(s) allow for, among other things, improved under chip bridge-System-in-Package (UCB-SiP) and improved methods of manufacturing the UCB-SiP.

As described herein, improvements of present invention include, but are not limited to, not requiring additional or special processing to create an embedded bridge configuration, which allows for the omission of a trough or channel required by prior art embedded bridge configurations. Further, some embodiments include a bridge thickness that is less than the size of one or more solder bumps interconnecting the dies and the substrate. Yet further, the method of preparing UCB-SiP described herein included flip-chip operations that allow for the use of one size of solder bump per operation. Moreover, the UCB configurations described herein, provide increased performance with existing processes. For example, one increase in performance is through the increased density as well as the distribution of signals using a bridge under chip solution as described herein. Further improvements and aspects of the present invention as described herein.

It should be readily appreciated that the embodiments of the systems, apparatus, and methods described herein may be configured in various additional and alternative manners in addition to those expressly described herein.

The UCB configurations described herein utilize a bridge height less than the interconnect height between a die and the substrate, which is flat and omits a trough. It will be appreciated that a flat substrate as described herein is flat within manufacturing variations. It is further appreciated, and as readily apparent from FIGS. 2 and 3 that a flat substrate does not include a trench nor does it include a lower plane of the bridge (e.g., 210) passing a upper plane of the substrate (e.g. 22). Additionally, regarding FIGS. 2 and 3, the interconnections illustrated are for solder bumps (e.g., 250A, 350A, etc.), and the illustrations omit illustrating metallization layers, solder pads, and metal pillars (e.g., copper pillars, etc.), any of which may be used with such solder bumps if appropriate for what is described herein as bumping, which is well-known.

Figure 2:
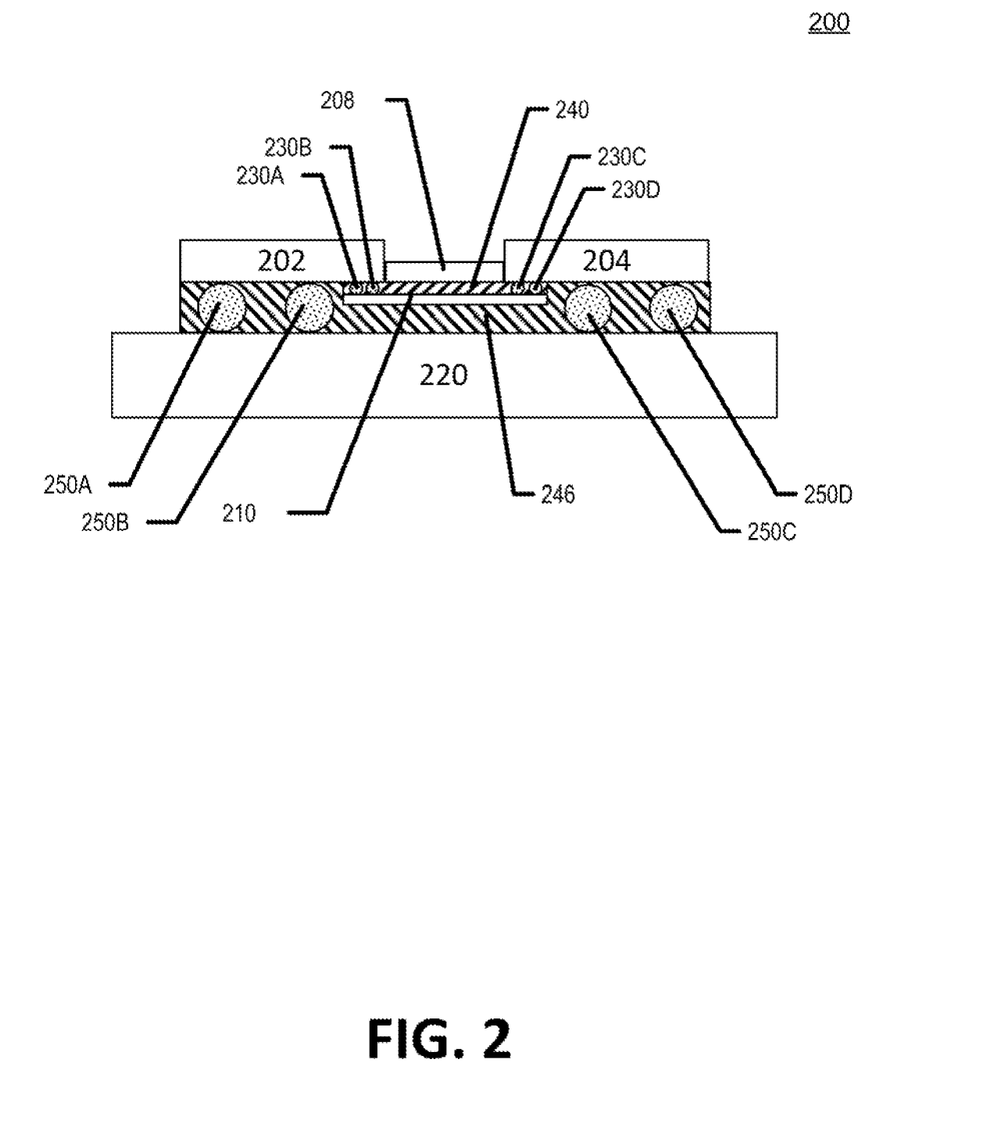
FIG. 2 illustrates an example of a bridge under chip connecting two dies in accordance with one or more embodiments of the present disclosure.

FIG. 2 illustrates an example of an UCB configuration 200 with bridge 210 under and connecting to two dies 202, 204 in accordance with one or more embodiments of the present disclosure. FIG. 2 illustrates a first die 202 and a second die 204 connected by a bridge 210. The die 202 is connected to bridge 210 by interconnects of solder bumps 230A, 230B, and die 204 is connected to bridge 210 by interconnects of solder bumps 230C, 230D. The dies 202, 204 are connected to substrate 220. Substrate 220 is connected to die 202 via solder bumps 250A, 250B; and substrate 220 is connected to die 204 via solder bumps 250C, 250D. For each of the solder bumps (e.g., 230A) or groups of solder bumps (e.g., 230A, 230B), the quantity of solder bumps illustrated is for illustrative purposes and it is readily appreciated that additional, including a large number of additional, interconnections may be in an embodiment of the present invention even though a figure illustrates only one or two solder bumps. While solder bumps are described, various embodiments may utilize one or more different interconnect methods, such as, but not limited to, those described in various embodiments herein.

While FIG. 2 is not drawn to a scale (nor is any other figure), embodiments of the present invention do include, as illustrated, that the height of bridge 210 is less than the height of the solder bumps 250 connecting the dies 202, 204 and the substrate 220. Additionally, and as is readily seen in FIG. 2, there is no trough in substrate 220. In other words, the top surface of substrate 220 is planar and/or flat. It will be appreciated that this description of planar and/or flat allows for variation in manufacturing while omitting a trough or channel. In various embodiments, similarly, the bottom of the dies 202, 204 and the top and bottom of bridge 210 are planar or flat.

In various embodiments, bridge 210 may be made of, for example, non-conductive substrate materials, such as silicon or glass, over with one or more trace maybe layered onto or buried internally. A trave may be comprised of one or more metals (e.g., copper, etc.). In various embodiments, the bridge 210 and the substrate may be made of the same material. Alternatively, in various embodiments the bridge 210 and the substrate 220 may be made of different materials.

In some embodiments, the interconnects illustrated with solder bumps 230A, 230B, 230C, 230D may formed by one of multiple processes, which are described herein. For example, in some embodiments, the interconnects illustrated may include thermal compression bonding. Alternatively, the bonding may include direct bonding which may omit solder bumps. The interconnects may range in height but are smaller than the size of the solder bumps connecting the dies 202, 204 to the substrate 220. In some embodiments, the height of the interconnects between dies 202, 204 and the bridge 210 may be between 10 microns and 55 microns.

The UCB configuration illustrate in FIG. 2 includes a reconstituted wafer 208. The reconstituted wafer 208 along with dies 202, 204 have a planar or flat bottom surface. As illustrated, the bottom surface of reconstituted wafer 208 may be planar with a bottom surface of dies 202, 204. As described herein, this bottom surface is prepared in one operation.

FIG. 2 illustrates two separate underfill layers: underfill 240 and underfill 246. Underfill 240 includes an underfill in the area between (i) the bottom surface of dies 202, 204 and reconstituted wafer 208 and (ii) the top surface of bridge 210. Underfill 246 includes, as illustrated in FIG. 2, an underfill in the area between (i) the bottom surface of dies 202, 204 and under bridge 210 and (ii) the top surface of substrate 220. While FIG. 2 depicts a cross section view, in various embodiments the area that is underfilled corresponds the area associated with a bridge. Underfill 240 and underfill 246 are applied in two separate operations as described herein.

In various embodiments, the connections on the bottom of dies 202, 204 will have multiple rows of connections. Bridge 210 may, through interconnections of solder bumps 230, connect to a portion or to all of the rows of connections on the respective sides of the dies 202, 204. In an embodiment with each of dies 202 and 204 having 10 rows of connections on the sides nearest to each other (e.g., the right side of die 202 and the left side of die 204 as illustrated in FIG. 2), the interconnects of solder bumps 250 connected to bridge 210 may include the first 5 rows nearest the edge of each of dies 202 and 204. The remaining connections of dies 202, 204 may be connected with interconnects to substrate 220 or may be left open. The connections on dies 202, 204 may include standard density connections or high density connections. In alternative embodiments, the interconnects of solder bumps 230 to the bridge 210 may be associated with all 10 rows of connections on dies 202, 204. In various embodiments, the portions of the connections on dies 202, 204 associated with interconnects of solder bumps 230 to a bridge 210 may comply one or more standards, including, but not limited to, AIB, UCIe, etc.

A die (e.g., 202) may include high density connections as well as standard or lower density connections. In various embodiments, both high density connections may be a portion a die (e.g., 202) and standard or lower density connections may be a portion of the die (e.g., 202). In various embodiments, the high density connections may be the portion of a die (e.g., 202) connected with interconnects to the bridge 210.

In various embodiments, a solder bump (e.g., 230) may only include a solder bump. Alternatively, or additionally, a solder bump (e.g., 230) illustrated may include a metal pillar, such as a copper pillar, in addition to the solder bump. Solder bump sizes may be a standard size. In various embodiments, the solder bumps interconnects may be prepared in separate flip-chip operations, which are described herein.

In various embodiments, the solder bump sizes between the dies 202, 204 and the substrate 220 may be of a 55 micron pitch. In various embodiments, these solder bumps sizes may be smaller or larger. In such embodiments, the bump size may a single bump size and the interconnects between the dies 202, 204 and the bridge 210 may use only solder pads and/or be direct bonded.

In various embodiments that utilize solder bumps to connect the dies 202, 204 with the substrate 220 and solder bumps to connect the dies 202, 204 with the bridge 210, the solder bumps 250 may be 55 micron pitch and the solder bumps at interconnects 230 may be 20 micron pitch.

In various embodiments, the height between the dies 202, 204 and the substrate 220 may be 55 to 250 microns. The bridge height from a first, top surface of the bridge to a second, bottom surface of the bridge may be 10 to 55 microns. The interconnect 230A between the die 202 and the bridge 210 may be between 10 and 25 microns. Thus, in various embodiments, the smaller pitch between the dies 202, 204 and the bridge 210 is finer than the pitch between the dies 202, 204 and the substrate 202, which allows for, as described herein, bumping one pitch size on a wafer at a time and not bumping multiple pitch sizes at once in preparing and manufacturing UCB configurations, which allows for flexibility and less complexity in the preparing and manufacturing of UCB configurations.

In various embodiments, a bridge may be comprised of two or more dielectric materials. The two or more dielectric materials may be chosen based on their dielectric constants, such having a first material with a higher dielectric constant and a second material with a lower dielectric constant. The different dielectric materials may be chosen to allow for a portion of a bridge to associated with a higher speed of transferring electrical signals.

Additionally, or alternatively, an underfill may include two or more materials to similarly tailor different dielectric constants surrounding different interconnects and or traces. For example, in various embodiments, solder bumps 250A, 250B may be surrounded by a first underfill material with a higher dielectric constant and solder bumps 250C, 250D may be surrounded by a second underfill material with a lower dielectric constant. The dielectric material of the underfill may change by die, by connections, and or by bridges.

While FIG. 2 illustrates a UCB configuration with a single bridge connecting two dies, more than one bridge may be used and/or a bridge may connect more than one dies. The additional bridge(s) may include a second bridge underneath the first bridge. Alternatively, or additionally, the additional bridge(s) may be in the same plane. Various embodiments of these variations are illustrated in FIG. 3 and FIGS. 4A-4D. These variations are exemplary, and additional variations not illustrated are within the scope of the present invention. A bridge may be placed under varying portions of connections of a chip. A chip may include a plurality of connection points of pad locations, which may be based on the pad sizing and pad spacing. In some embodiments, the bridge may provide interconnections for 50% of these connection points. Alternatively, the bridge may provide connections for any percentage of these connection points, such as 20%, 25%, or 33%. The percentage of connection points may, in some embodiments, be based on the configuration of how many bridges are present as well as how many dies a first die is connected to.

Figure 3:
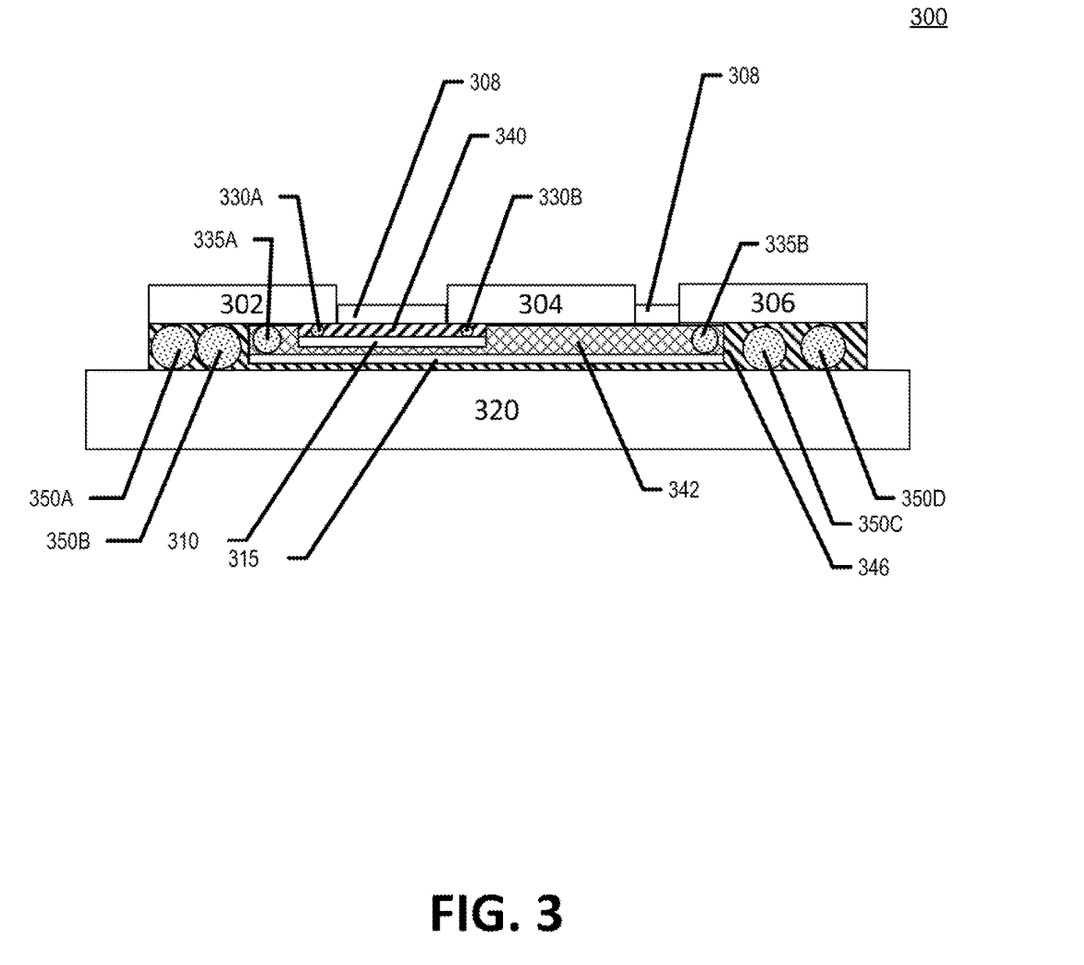
FIG. 3 illustrates an example of two bridges under chip connecting three dies in accordance with one or more embodiments of the present disclosure.

FIG. 3 illustrates an example of an UCB configuration 300 with a first bridge 310 and a second bridge 315 under three dies 302, 304, 306 in accordance with one or more embodiments of the present disclosure. The first bridge 310 connects dies 302, 304, and the second bridge 315 connects dies 302, 306. The die 302 is connected to the first bridge 310 by interconnects of solder bump 330A, and die 304 is connected to the first bridge 310 by interconnects of solder bump 330B. The die 302 is connected to the second bridge 315 by an interconnect of solder bump 335A, and die 306 is connected to the second bridge 315 by an interconnect of solder bump 335B. The dies 302, 304, 306 are connected to substrate 320. Substrate 320 is connected to die 202 by interconnects of solder bumps 350A, 350B. Substrate 320 is connected to die 304 by interconnects of solder bumps 350C, 350D. The interconnects connecting dies 304 to substrate 320 are not illustrated in FIG. 3, though they may be the same type of interconnect as illustrated between dies 302, 305 and the substrate 320. For each of the solder bumps (e.g., 230A) or groups of solder bumps (e.g., 230A, 230B), the quantity of solder bumps illustrated is for illustrative purposes and it is readily appreciated that additional, including a large number of additional, interconnections may be in an embodiment of the present invention even though a figure illustrates only one or two solder bumps.

The UCB configuration illustrate in FIG. 3 includes a reconstituted wafer 308. The reconstituted wafer 308 along with dies 302, 304, 306 have a planar or flat bottom surface. As illustrated, the bottom surface of reconstituted wafer 308 may be planar with a bottom surface of dies 302, 304, 306. As described herein, this bottom surface is prepared in one operation. Additionally, while the reconstituted wafer 308 is not illustrated as having the same top height as the dies 302, 304, 306, it is appreciated that it may have the same height or, alternatively, may form a layer on top of dies 302, 304, 306.

FIG. 3 illustrates three separate underfill layers: underfill 340, underfill 342, and underfill 346. Underfill 340 includes an underfill in the area between (i) the bottom surface of dies 302, 304 and reconstituted wafer 308 and (ii) the top surface of bridge 310. Underfill 342 includes, as illustrated in FIG. 3, an underfill in the area between (i) the bottom surface of dies 302, 304, 306, the bottom surface of bridge 310, and the bottom surface of reconstituted wafer 308 and (ii) the top surface of bridge 315. Underfill 346 includes, as illustrated in FIG. 3, an underfill in the area between (i) the bottom surface of dies 302, 306 and under bridge 315 and (ii) the top surface of substrate 220. While FIG. 3 depicts a cross section view, in various embodiments the area that is underfilled corresponds the area associated with a bridge. Underfill 340, 342, and 346 are applied in separate operations as described herein.

In various embodiments, such as that illustrated in FIG. 3, the size of two bridges 310, 3115, the interconnects 330A, 330B, 335A, 335B to the two bridges 310, 315, and the underfill layers are, collectively, of a height that is less than the size of a solder bump (e.g., 350A) connecting the dies (e.g., 302) with the substrate (e.g., 320). In an exemplary embodiment, the height of a solder bump 350A may be 100 microns and the height of each of bridges 310 and 315 may be 20 microns each. The interconnects between die 302 and bridge 310 may be 10 microns, and the interconnects between die 302 and bridge 315 may be 40-55 microns.

By varying the size of the bridges and the interconnects to the bridges, more than one bridge may be utilized. In various embodiments utilizing more than one bridge, there may be interconnects between bridges in order to route signals from a first bridge to a second bridge. In various embodiment utilizing more than one bridge above another bridge, the higher bridge may include one or more apertures allow for the bridge underneath to connect to a die or bridge above this higher bridge.

FIGS. 4A, 4B, 4C, and 4D illustrate examples of top-down perspectives of configurations utilizing bridge under chip configurations in accordance with one or more embodiments of the present disclosure. The top down perspective illustrates how two or more dies may be connected by one or more bridges in configurations that may or may not be similar to the configurations illustrated in FIGS. 2 and 3. As is readily appreciated, while FIGS. 4A, 4B, 4C, and 4D illustrate only dies and bridges in order to simplify the figures, additional components of a UCB configuration as described herein (e.g., solder bumps, underfill, etc.) may be used with such configurations.

Figure 4A:
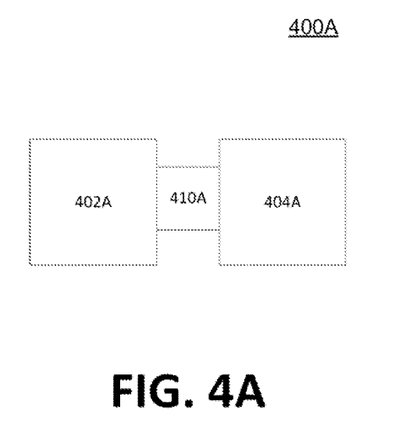
FIGS. 4A, 4B, 4C, and 4D illustrate examples of top-down perspectives of configurations utilizing bridge under chip configurations in accordance with one or more embodiments of the present disclosure.

FIG. 4A illustrates a configuration 400A of two dies 402A, 404A connected by one bridge 410A. In various embodiment, the top-down perspective of FIG. 4A may be illustrating a top-down perspective FIG. 2. In various alternative embodiments, the top-down perspective of FIG. 4A may be illustrating a top-down perspective that may include more than one bridge, but the bridge(s) after the first bridge 410A is not illustrated in FIG. 4A due to not being visible from a top-down perspective. Thus, as is readily appreciated, the exemplary configurations illustrated in FIGS. 4A, 4B, 4C, and 4D may include one or more additional bridges or other components not illustrated in the figures.

Figure 4B:
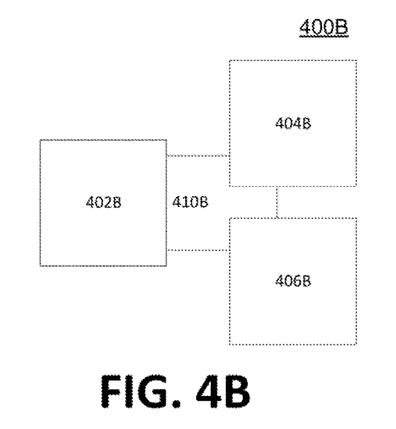

FIG. 4B illustrates a configuration 400B of three dies 402B, 404B, 406B connected by a bridge 410B. The first die 402B is connected to the second die 404B and the third die 406B by a first bridge 410B. As illustrated, one bridge connects three dies.

Figure 4C:
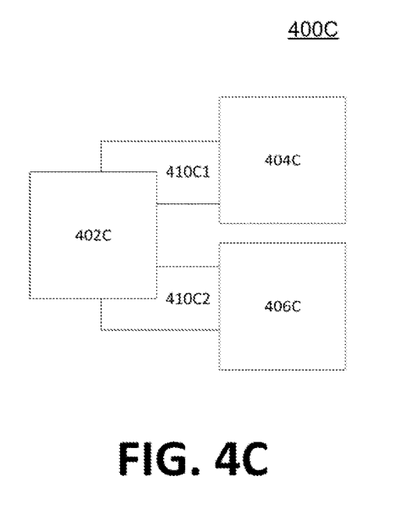

FIG. 4C illustrates a configuration 400C of three dies 402C, 404C, 406C. The first die 402C is connected to the second die 404C with first bridge 410C1, and the first die 402C is connected to the third die 406C with second bridge 410C2. Additionally, though not illustrated in FIG. 4C, the second die 404C and the third die 406C may be connected by one or more bridges.

Figure 4D:
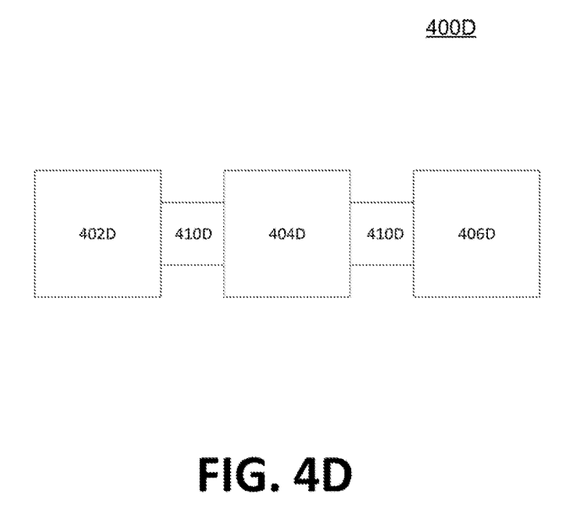

FIG. 4D illustrates a configuration 400D of three dies 402D, 404D, and 406D connected by a single bridge— bridge 410D. As illustrated, bridge 410D runs underneath the entirety of die 404D and also connects to die 406D.

In various embodiments, and not illustrated in the figures, the portion of a chip not connected to the bridge may include input/output connections, control line connections, and power connections, which may be by through-silicon vias in the substrate. In some embodiments, such connections may be connected to the chip through wire jumpers connecting to the top of the chip.

Having now generally described several embodiments of bridge under chip configurations in accordance with the present invention, several exemplary operations according to exemplary embodiments of manufacturing such configurations will be described. In some example embodiments, a bridge under chip configuration as described herein may be manufactured according to some or all of the operations described herein. While the following description is of multiple operations, it is readily appreciated that some of the following operations omitted.

FIGS. 5-10 illustrate flowcharts associated with preparing, assembling, and/or manufacturing a UCB-SiP in accordance with embodiments of the present invention. These figures include multiple operations. As is readily appreciated, some of these operations may be omitted while others may be repeated. Additionally, the order of operations should not be interpreted as limiting as the order of these operations may be varied.

The preparing of a UCB-SiP involves multiple operations and the following terminology is used herein to assist with the description of variation stages of the dies and bridge as it becomes a UCB-SiP.

The term "die-SiP" refers to one or more dies connected by a reconstituted wafer.

The term "bridged die-SiP" refers to one or more dies connected by a reconstituted wafer, which are connected to one or more bridges with interconnections, such as solder bumps.

The term "UCB-SiP" refers to a bridged die-SiP that is connected to a substrate with interconnections, such as solder bumps.

Figure 5:
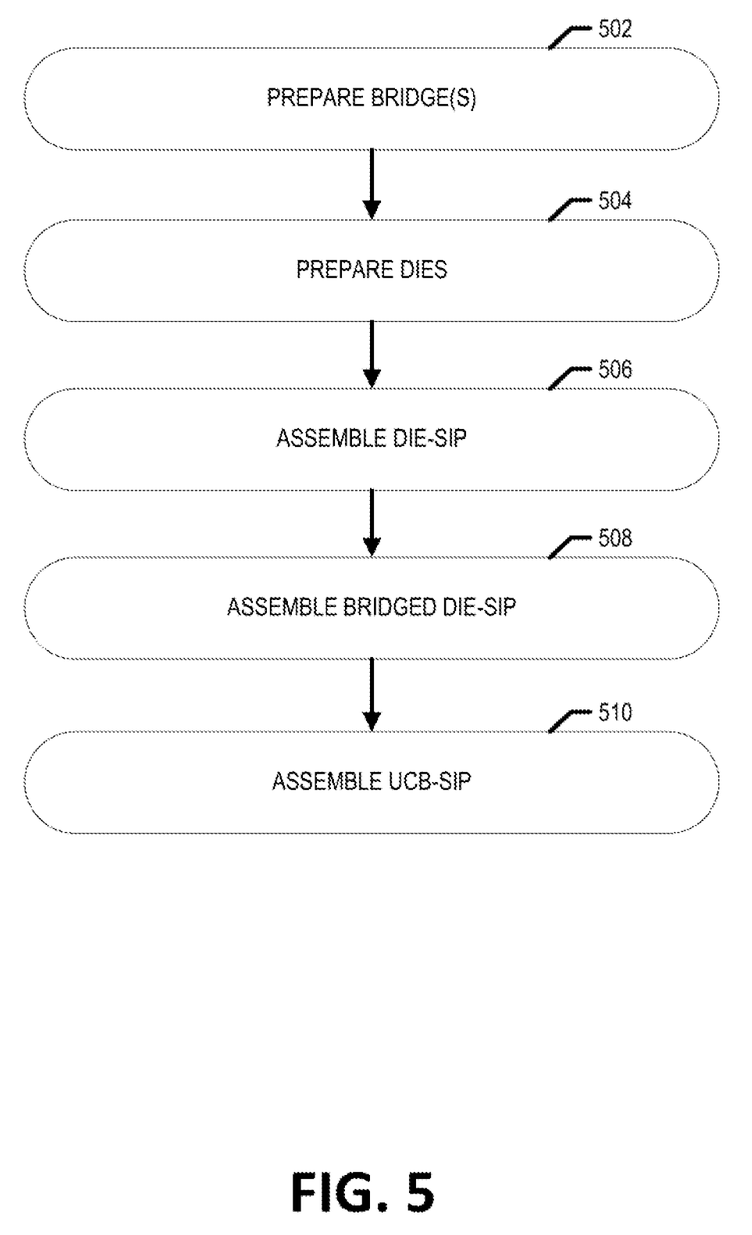
FIG. 5 illustrates a flowchart according to an example method for preparing an under chip bridge-SiP (UCB-SiP) in accordance with one or more embodiments of the present disclosure.

FIG. 5 illustrates a flowchart according to an example method for preparing an UCB-SiP in accordance with one or more embodiments of the present disclosure.

Figure 6:
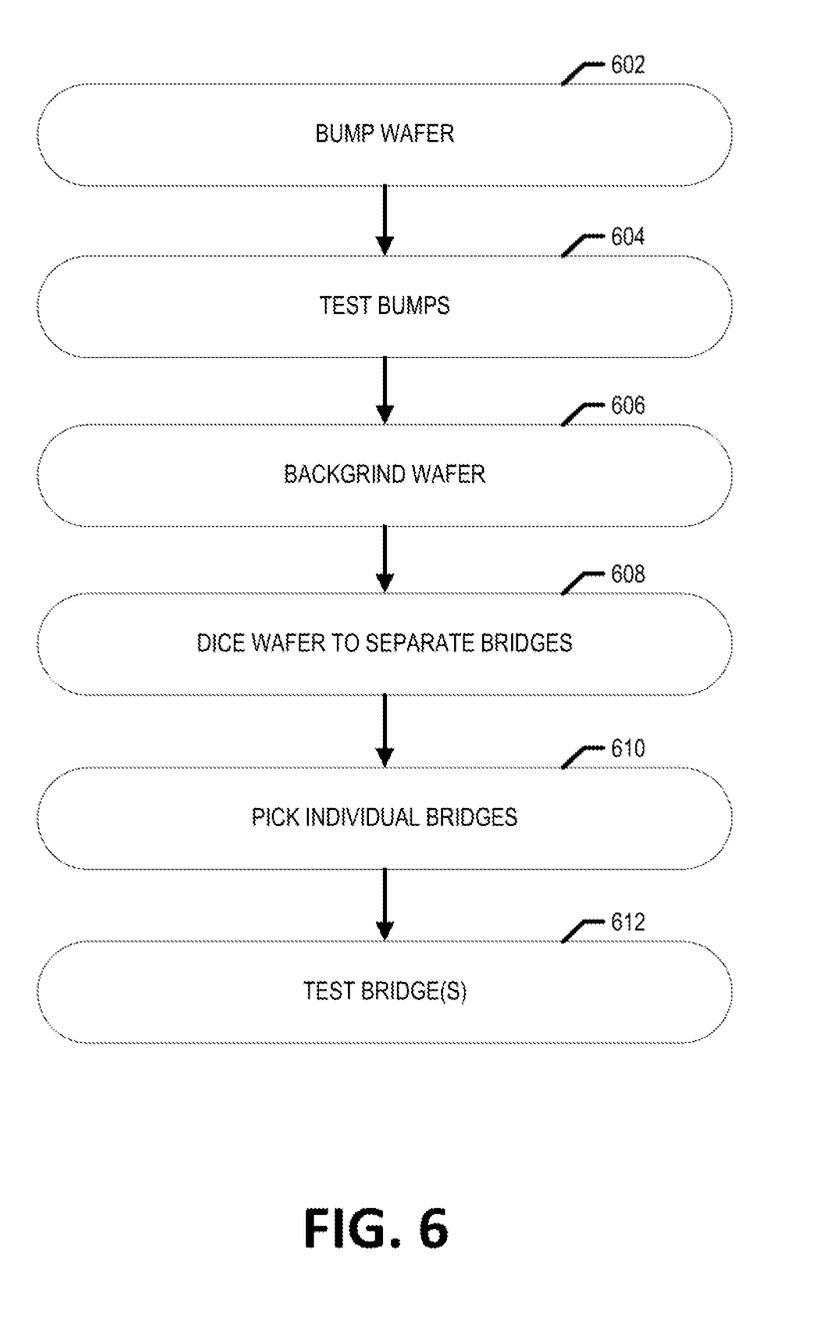
FIG. 6 illustrates a flowchart according to an example method for preparing a bridge in accordance with one or more embodiments of the present disclosure.

Operation 502 includes preparing a bridge, which is further described herein with regard to FIG. 6.

Figure 7:
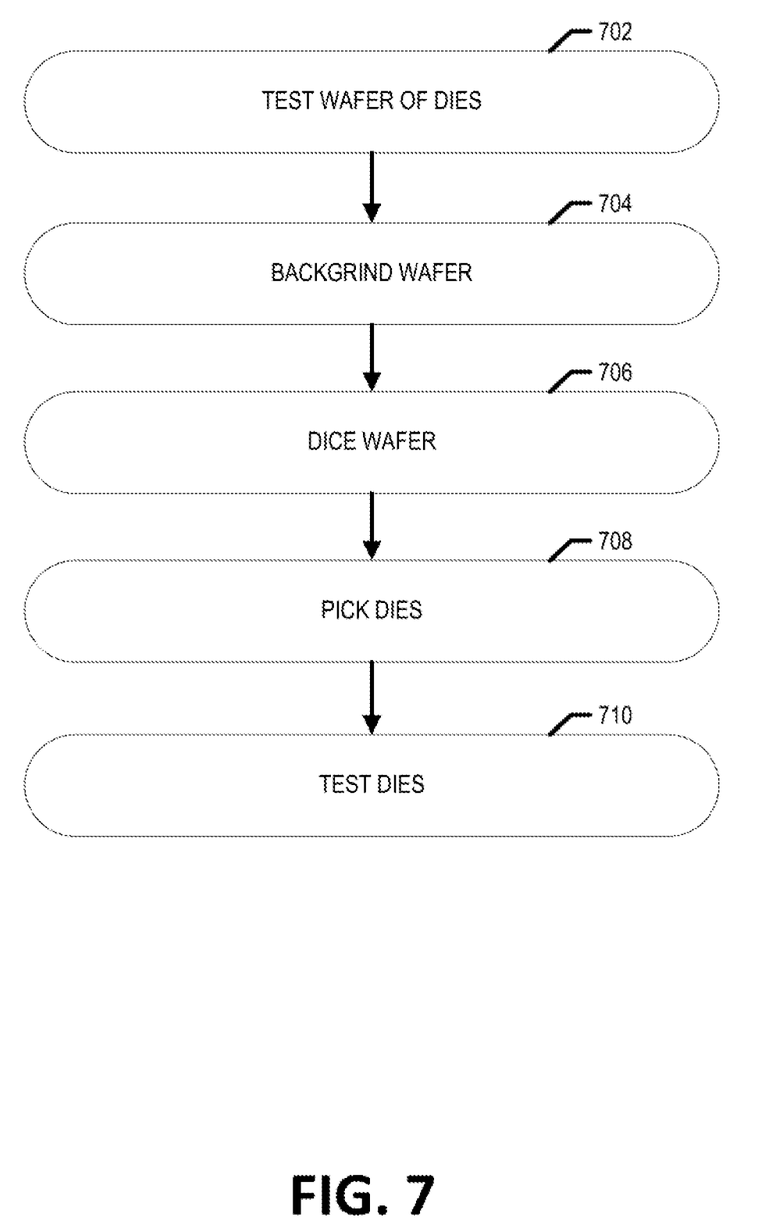
FIG. 7 illustrates a flowchart according to an example method for preparing dies in accordance with one or more embodiments of the present disclosure.

Operation 504 includes preparing two or more dies, which is further described herein with regard to FIG. 7.

Figure 8:
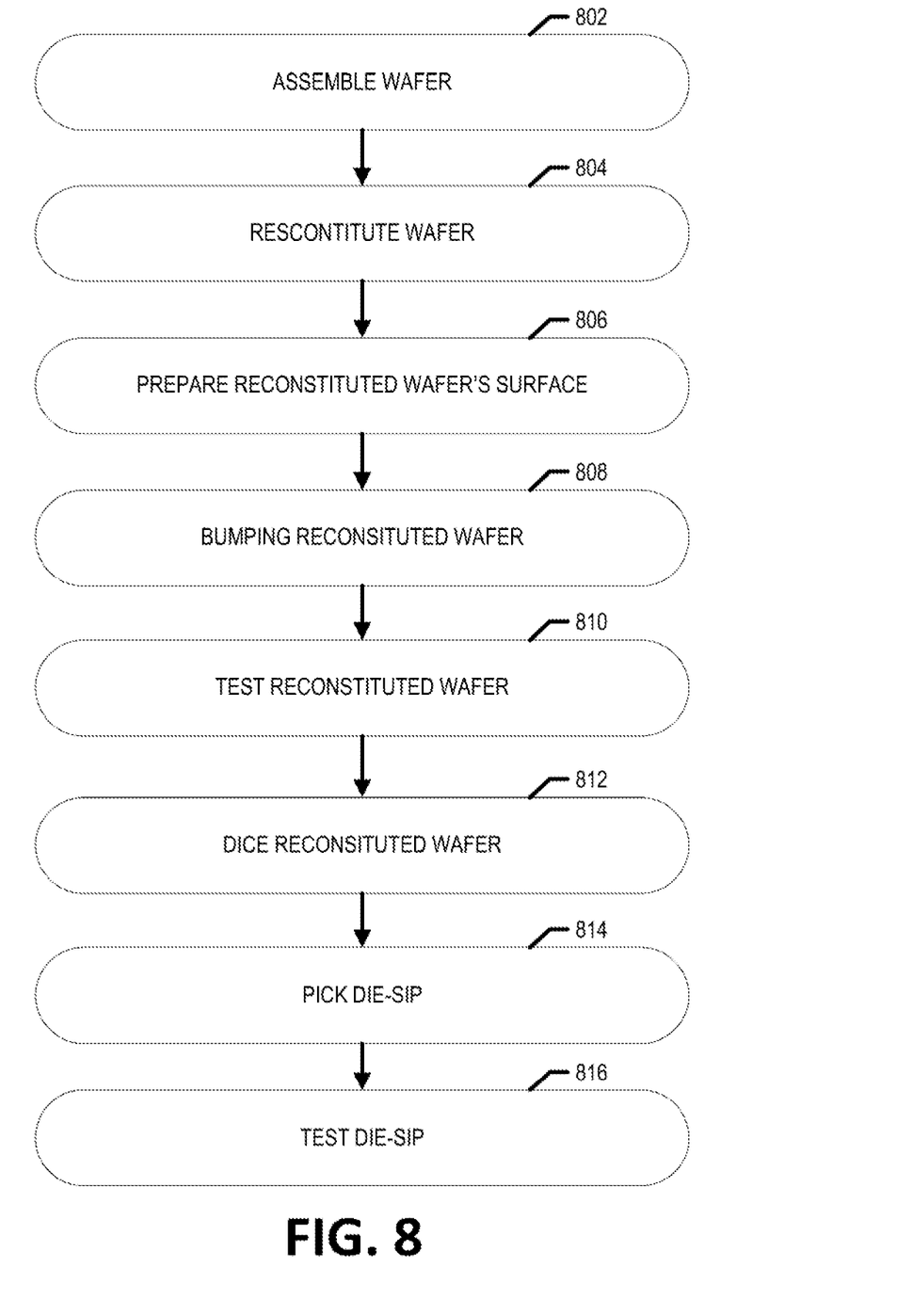
FIG. 8 illustrates a flowchart according to an example method for reconstituting a wafer in accordance with one or more embodiments of the present disclosure.

Operation 506 includes assembling a die-SiP, which is further described herein with regard to FIG. 8.

Figure 9:
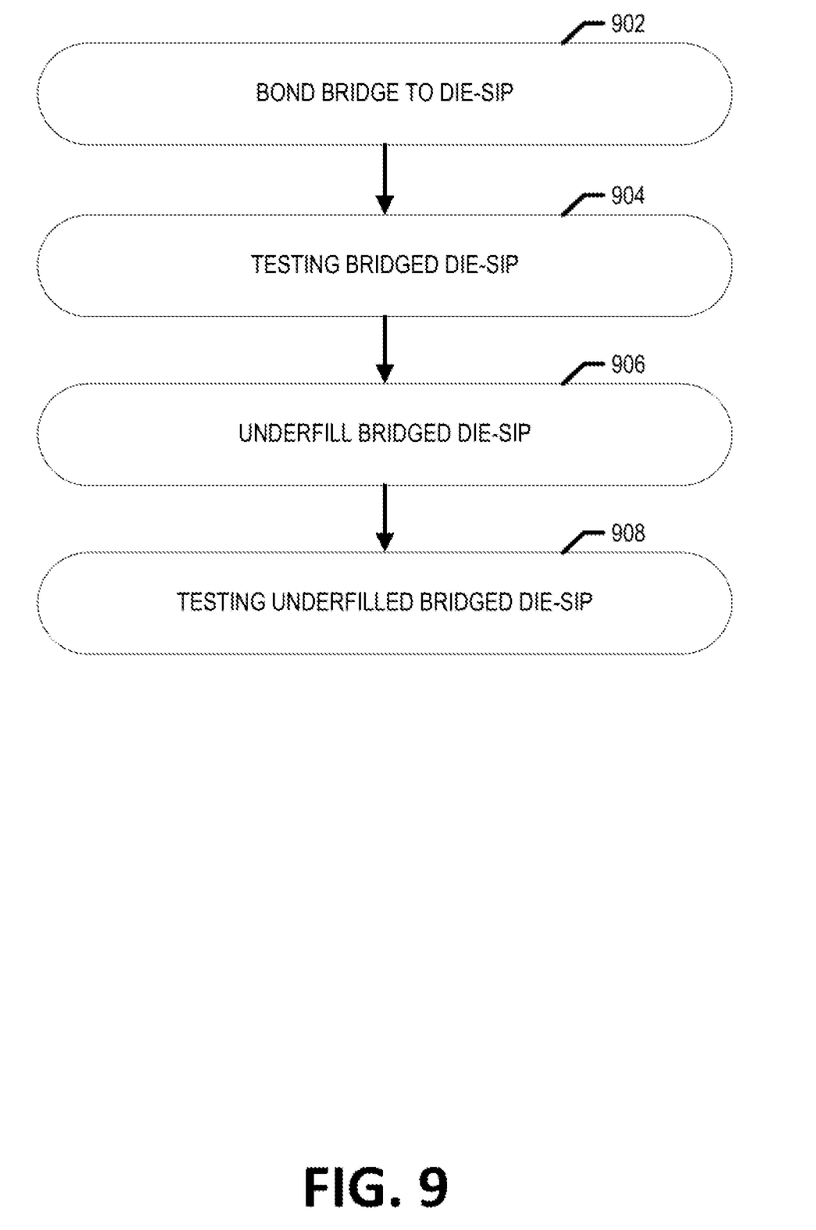
FIG. 9 illustrates a flowchart according to an example method for assembling a bridge in accordance with one or more embodiments of the present disclosure.

Operation 508 includes assembling a bridged die-SiP, which is further described herein with regard to FIG. 9.

Figure 10:
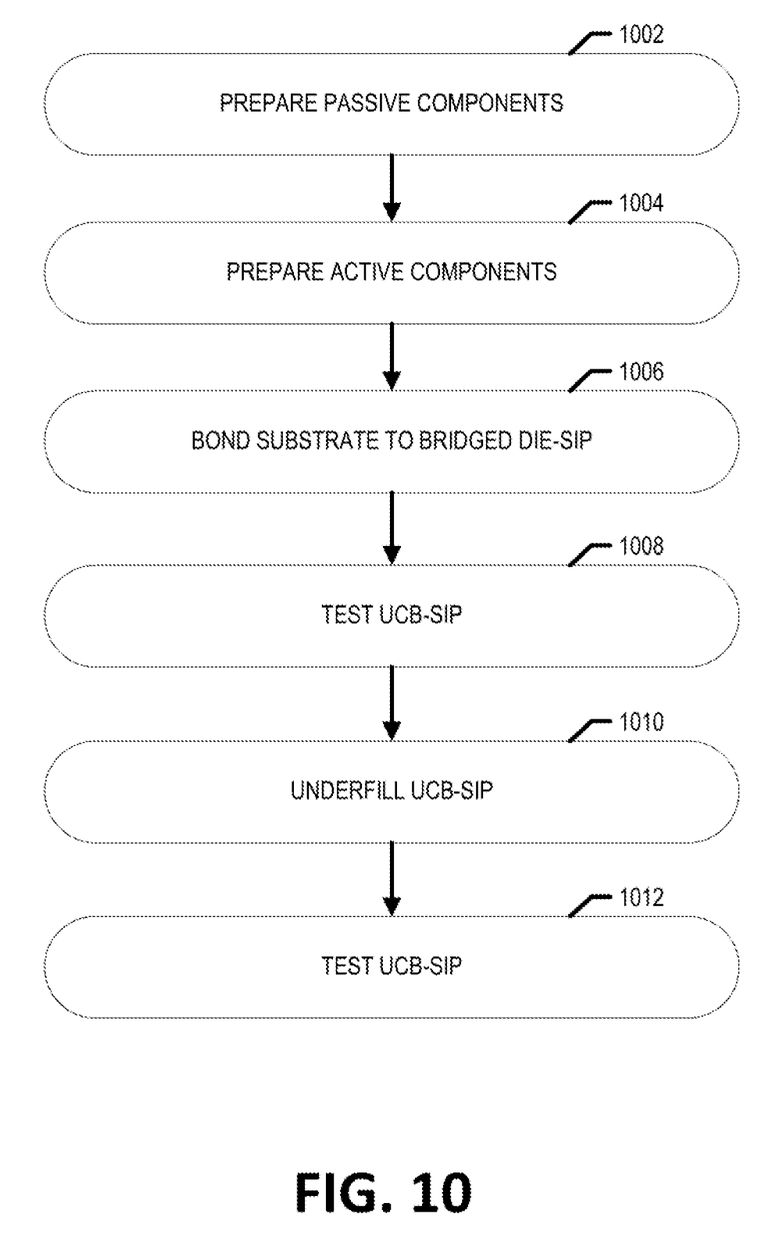
FIG. 10 illustrates a flowchart according to an example method for assembling a UCB-SiP in accordance with one or more embodiments of the present disclosure.

Operation 510, includes assembling a UCB-SiP, which is further described herein with regard to FIG. 10.

The various operations described herein include use of flip chip configurations. In contrast to an embedded bridge configuration of the prior art, which is described herein, the present invention allows for not having to use two sizes of solder bumps during one flip chip operation. For example, in the embedded bridge configuration, the connection of the bridge and the substrate to the die may occur in the same operation and, thus, solders bumps for both the dies to bridge connections as well as the dies to substrate connections will be done at the same time though these may be different sizes of solder bumps. The present invention, as described herein, does not require making such connections with two different solder bump sizes in one operation. This improves the ease of manufacturing of the present invention, which is an improvement over embedded bridge configurations.

The present invention described herein includes, for example, embodiments comprised of two or more bridges. To add a bridge beyond the first bridge, operations may be repeated. In some embodiments, operation 508 may be repeated for each bridge. Alternatively, depending on a configuration certain operations may be omitted.

FIG. 6 illustrates a flowchart according to an example method for preparing a bridge in accordance with one or more embodiments of the present disclosure. The following description includes preparing one or more bridges in one wafer. The fabrication of multiple bridges may occur from one wafer and, thus, multiple bridges may be prepared in parallel. While the description herein is in regard to one wafer, the process may be applied to multiple wafers in parallel.

In various embodiments, the bridge may be comprised of silicon as well as electrical traces, which may be made of, for example, copper. A single bridge may be prepared from the silicon wafer by dicing a wafer into the multiple bridges. In various embodiments, these bridges may include solder pads at each end of traces that are to be used for connecting a bridge (e.g., 210) to a die (e.g., 204). A wafer, including the bridges with their traces and connections, would have been manufactured prior to preparing a bridge from a wafer. Thus one or more bridges in a wafer may be provided prior to the operations in FIG. 6.

Operation 602 includes bumping a wafer. While multiple bridges are still in the wafer, the bumping of the wafer includes applying solder bumps to the connections on a bridge 210 that are associated with corresponding connections on the dies 202, 204. The solder bumps may be applied to solder pads. In various embodiments, the solder bumps being applied to the wafer may be of a single size, which may include, but is not limited to, the sizes of 55 microns, 20 microns, or 10 microns. In various embodiments, the bumping would include copper pillars.

Operation 604 includes testing the bumped wafer. The testing may include, for example, inspecting that the bumping of the wafer at operation 602 correctly and uniformly bumped the wafer to the chosen bump size. If a part of the wafer does not pass testing, operation 602 may be repeated or, alternatively, one or more bridges in the wafer may be identified to be discarded at a later operation, such as after dicing the wafer.

Operation 606 includes backgrinding the wafer. The backgrinding of a wafer may be to grind a wafer to a smaller height. In various embodiments, a wafer may start with a certain height (e.g., 725-750 microns) and the backgrinding may reduce the height of the wafer. For example, the height may be reduced to between 55 microns to 10 microns.

Operation 608 includes dicing wafers. The dicing of the wafer may separate the one or more bridges in the wafer from each other and from additional wafer material such that each bridge may be extracted from the wafer.

Operation 610 includes picking individual bridges. As the bridges have been separated during the dicing of operation 608, the individual bridges are picked. The remainder of the material, which may include one or more bridges previously identified, may be discarded in regard to further operations. The picking of individual bridges may also include discarding bridges identified as not passing one or more tests.

Operation 612 includes testing bridge(s). The individual bridges may be tested, such as via inspection to determine that there are no errors or flaws associated with the individual bridges. The inspection may include visual inspection as well as one or more measurements that the bridge is to size and that the bumps of an individual bridge are correct.

In various embodiments, interconnects may alternatively, or additionally, be formed via direct bonding.

In various embodiments, one or more dies for a UCB-SiP may be provided on one or more wafers prior to the operations of FIG. 7. The operations of FIG. 7 describe preparing dies, and it will be appreciated that if the dies for a UCB-SiP are provided on more than one wafer then the respective die from each wafer for the UCB-SiP will need to be prepared.

FIG. 7 illustrates a flowchart according to an example method for preparing dies in accordance with one or more embodiments of the present disclosure. Dies may come from one or more different sources and, thus, the preparation of dies includes preparing the dies for use in the embodiments described herein.

Operation 702 includes testing the wafer of dies. The testing may include inspection of the dies, including for the correct placement and sizing of the interconnect pads. In various embodiments a die 202 may be associated with at least two interconnect sizes, such as the interconnects to the bridge 210 (e.g., a fine pitch interconnect pad) and interconnects to the substrate 220 (e.g., standard pitch interconnect pad). In various embodiments with additional bridges, there may be additional sizes of interconnect pads.

Operation 704 includes backgrinding wafer. The backgrinding will grind the wafer to a specified thickness. In various embodiments where the dies are different, such as die 202 being different from die 204, each die may be on a separate wafer. Each of such wafers may be manufactured with a different thickness.

Operation 706 includes dicing the wafer. The dicing of the wafer separates the individual die (e.g., 202) that make up the wafer.

Operation 708 includes picking dies. Once each individual die has been diced from the wafer, the individual die may be picked and separated from the wafer and may be extracted from the wafer.

Operation 710 includes testing a die. The individual die may be tested, such as via inspection to determine that there are no errors or flaws associated with the individual die. The inspection may include visual inspection as well as one or more measurements that the die is to size and that the connections for the die are correct.

In various embodiments, and as described herein, the interconnect pads associated with the bridge will not be bumped—will not receive solder bumps—during the operations of FIG. 7 as the bridge preparation includes bumping the bridge for connections that correspond to the interconnect pads on the dies. In various embodiments, an additional operation may be included in FIG. 7 to add an underbump metallization (e.g., pad) that may receive the solder bump of the associated bridge, which may be done prior to dicing the wafer at operation 706.

After the individual dies have been separated from a wafer, a wafer is reconstituted, which includes combining the different dies (e.g., 202, 204) that are to comprise a UCB-SiP.

FIG. 8 illustrates a flowchart according to an example method for reconstituting a wafer in accordance with one or more embodiments of the present disclosure.

Operation 802 includes assembling wafer. In assembling the wafer, each of the dies (e.g., 202, 204) in a bridged die-SiP will be placed very accurately on a surface. In assembling the wafer, each of the dies are placed active side down. The accurately placed dies 202, 204 are configured so that a bridge 210 may be placed, such as in a later flip-chip operation, onto the dies 202, 204. Thus the dies 202, 204 are placed in the correct pattern to receive a bridge 210. In various embodiments, the reconstituted wafer may be an 12 inch wafer, an 8 inch wafer, a 6 inch wafer, a 4 inch wafer, or smaller. The size of the reconstituted wafer may vary based on the number of dies being included in the formation of the reconstituted wafer.

Operation 804 includes reconstituting the wafer. After the dies have been placed, a reconstituted wafer is created through wafer molding. With the reconstituted wafer, each of the individual die 202, 204 are now physically connected in place by one or more portions of the reconstituted wafer.

Operation 806 includes preparing the reconstituted wafer's surface. The active side of the reconstituted wafer (e.g., the side with connections for the interconnects) is prepared by removing any foreign material. In various embodiments, such preparation may include plasma cleaning to remove foreign material from the molding process.

Operation 808 includes bumping the reconstituted wafer's surface. The connections of dies for connections to the bridge 210 are prepared with underbump metallization. The pads for connections for interconnects to the substrate 220 are prepared with underbump metallization as well as solder bumps, which may include metal pillars (e.g., copper pillars). The size of the solder bumps during this bumping operations are of a single size.

Operation 810 includes testing the reconstituted wafer. The testing may include visual inspection of the prior operations, including to ensure that bumping has occurred corrected. If one or more die-SiP fail testing, one or more prior operations may be repeated. The testing may include probing of connections on the wafer to perform electrical tests, such as validation of the connections of the die-SiP.

Operation 812 includes dicing the reconstituted wafer. The reconstituted wafer is diced such that individual die-SiP to be bridged are separated as single packages and may be extracted from the reconstituted wafer.

Operation 814 includes picking die-SiP. Once each die-SiP has been diced from the wafer, the individual die-SiP may be picked and separated. Any die-SiP that failed to pass a previous test may be discarded.

Operation 816 includes testing die-SiP. The individual die-SiP may be tested, such as via inspection to determine that there are no errors or flaws associated with the individual die-SiP. The inspection may include visual inspection as well as one or more measurements that the die is to size and that the connections for the die-SiP are correct.

After the die-SiP have been formed and diced from a reconstituted wafer, a bridge is attached.

FIG. 9 illustrates a flowchart according to an example method for assembling a bridged die-SiP in accordance with one or more embodiments of the present disclosure.

Operation 902 includes bonding a bridge to the die-SiP. The bonding may be one of multiple processes, including but not limited to thermal compression bonding, anisotropic conductive film, direct bond interconnects, gold-gold bonding, mass reflow, etc. The bonding process may vary according to the type and/or size of interconnects 230A, 230B between the dies 202, 204 and the bridge 210.

Operation 904 includes testing the bridged die-SiP. The testing may include a visual inspection as well as one or more electrical tests to confirm the electrical connections are appropriately bonded.

Operation 906 includes underfilling the bridged die-SiP, specifically the area between the die-SiP and the bridge. In various embodiments, the underfill may be an epoxy based underfill. Alternatively, in various embodiments, an underfill may be omitted where a bonding processing may include a film or epoxy as part of the bonding that would otherwise fill the area of underfill between the die-SiP and the bridge.

Operation 908 includes testing the undefiled bridged die-SiP. The testing may include a visual inspection as well as one or more electrical tests to confirm the electrical connections are appropriately bonded.

FIG. 10 illustrates a flowchart according to an example method for assembling a bridged die-SiP in accordance with one or more embodiments of the present disclosure.

Operation 1002 includes preparing passive components. In various embodiments, one or more passive components may be included on a substrate and/or a die. The passive component will be added and connected. To the extent a connection requires wire bonding, such as to a passive component on a substrate, that wire bonding may be added. In various embodiments, such wire bonding may be from the top of a die to the passive component. In various embodiments, one or more passive components on a die may be mounted face-to-face with the die such that the passive component is, for example, on the lower portion of a die 202 of FIG. 2.

In various embodiments, a passive component may be included in on a bridge. In some embodiments with one or more passive components on a bridge, the active components may be part of one or more connections (e.g., traces) on a bridge connecting two or more dies. The one or more passive components may be mounted face-to-face on the bridge during a previous operation before applying underfill. Additionally, or alternatively, a passive component may also be mounted on a substrate and connected to a bridge (e.g., wire bonded, etc.), which may also occur prior to an underfilling operation.

Operation 1004 includes preparing active components. In various embodiments, one or more active components may be included on a substrate and/or a die. The active component will be added and connected. To the extent a connection requires wire bonding, such as to an active component on a substrate, that wire bonding may be added. In various embodiments, such wire bonding may be from the top of a die to the active component. In various embodiments, one or more active components on a die may be mounted face-to-face with the die such that the active component is, for example, on the lower portion of a die 202 of FIG. 2.

In various embodiments, an active component may be included in on a bridge. In some embodiments with one or more active components on a bridge, the active components may be part of one or more connections (e.g., traces) on a bridge connecting two or more dies. The one or more active components may be mounted face-to-face on the bridge during a previous operation before applying underfill. Additionally, or alternatively, an active component may also be mounted on a substrate and connected to a bridge (e.g., wire bonded, etc.), which may also occur prior to an underfilling operation.

Operation 1006 includes bonding a substrate to bridged die SiP. The bonding may be one of multiple processes, including but not limited to thermal compression bonding, anisotropic conductive film, mass reflow, etc. The bonding process may vary according to the type and/or size of interconnects 230A, 230B between the dies 202, 204 and the substrate 220.

Operation 1008 includes testing the UCB-SiP. The testing may include a visual inspection as well as one or more electrical tests to confirm the electrical connections are appropriately bonded.

Operation 1010 includes underfilling the UCB-SiP, specifically the area between the bridged die-SiP and the substrate. In various embodiments, the underfill may be an epoxy based underfill.

Operation 1012 includes testing the UCB-SiP. The testing may include a visual inspection as well as one or more electrical tests to confirm the electrical connections are appropriately bonded.

In various embodiments, an underfill operation may be flowed into space(s) between the dies, substrate, and interconnects. The underfill may be dispensed at one or more locations and flowed into the space(s). In various embodiments, underfill may be pre-dispensed in one or more spaces, such as on top of a substrate and/or a bridge. The pre-dispensed underfill material may include a thermal material, which may be used to direct heat away from one or more spaces. Additionally, or alternatively, a thermal material may be pre-dispensed into one or more spaces that will subsequently have underfill flowed into and/or on top of the space(s).

While this specification contains many specific embodiment and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are illustrated in the drawings in a particular order, this should not be understood as requiring that such operations be performed in the particular order shown or in sequential order, or that all illustrated operations be performed, to achieve desirable results. In certain circumstances, operations in alternative ordering may be advantageous. In some cases, the actions recited in the claims may be performed in a different order and still achieve desirable results.

Thus, while particular embodiments of the subject matter have been described, other embodiments are within the scope of the following claims.

The invention claimed is:

1. An under chip bridge system-in-package comprising:
a first die;
a second die;
a substrate having a first surface, wherein the first surface of the substrate is connected to the first die and the second die with a plurality of connections, wherein the first surface of the substrate is flat, and wherein a thickness of the plurality of connections to the first and the second die are the same height;
a bridge comprising a first surface, wherein the first surface of the bridge is connected the first die and to the second die, wherein the thickness of the plurality of connections to the first die and the thickness of the plurality of connections to the second die are the same height, wherein the bridge has a thickness and the bridge thickness is uniform for an entirety of the bridge, and wherein the thickness of the bridge is less than the thickness of the plurality of connections between the substrate and the first die;
a third die;
a second bridge comprising a first surface, wherein the first surface of the second bridge is connected the first die and to the third die, wherein the second bridge has a thickness and the second bridge thickness is uniform for the entirety of the second bridge, and wherein the thickness of the second bridge is less than the thickness of the plurality of connection between the substrate and the first die; and
wherein a portion of the second bridge is located between a portion of the bridge and the substrate.

2. The under chip bridge system-in-package of claim 1, wherein an area of the first surface of the substrate is greater than an area of the first surface of the bridge.

3. The under chip bridge system-in-package of claim 1, wherein the first die comprises a first plurality of high density connections, wherein the second die comprises a second plurality of high density connections, wherein the plurality of connections of the bridge to the first die is associated with a portion of the first plurality of high density connections of the first die, and wherein the plurality of connections of the bridge to the second die is associated with a portion of the second plurality of high density connections of the second die.

4. The under chip bridge system-in-package of claim 1, wherein the thickness of the bridge is less than 55 microns.

5. The under chip bridge system-in-package of claim 1, wherein the first surface of the bridge is connected the third die.

6. The under chip bridge system-in-package of claim 1 further comprising one or more active components.

7. The under chip bridge system-in-package of claim 1 further comprising one or more passive components.

8. The under chip bridge system-in-package of claim 1 further comprising one or more active components or passive components connected to the bridge.

* * * * *